(12) United States Patent
Chung

(10) Patent No.: US 6,548,374 B2
(45) Date of Patent: Apr. 15, 2003

(54) METHOD FOR SELF-ALIGNED SHALLOW TRENCH ISOLATION AND METHOD OF MANUFACTURING NON-VOLATILE MEMORY DEVICE COMPRISING THE SAME

(75) Inventor: Byung-Hong Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/875,518

(22) Filed: Jun. 6, 2001

(65) Prior Publication Data

US 2002/0019113 A1 Feb. 14, 2002

(30) Foreign Application Priority Data

Aug. 2, 2000 (KR) .......................................... 2000-44805

(51) Int. Cl.$^7$ ............................................... H01L 21/76
(52) U.S. Cl. ....................... 438/424; 438/296; 438/435; 438/700
(58) Field of Search ................................ 438/296, 424, 438/435, 700

(56) References Cited

U.S. PATENT DOCUMENTS

| | | | |
|---|---|---|---|
| 5,780,346 A | * 7/1998 | Arghavani et al. | 438/296 |
| 5,985,735 A | * 11/1999 | Moon et al. | 438/435 |
| 6,013,551 A | 1/2000 | Chen et al. | 438/264 |
| 6,063,689 A | * 5/2000 | Chen et al. | 438/424 |
| 6,150,235 A | * 11/2000 | Doong et al. | 438/424 |
| 6,153,480 A | * 11/2000 | Arghavani et al. | 438/296 |

OTHER PUBLICATIONS

John L. Vossen et al. Thin Film Processes II Academic Press, Inc. 1991 p. 319.*

* cited by examiner

Primary Examiner—Carl Whitehead, Jr.
Assistant Examiner—David S Blum
(74) Attorney, Agent, or Firm—Mills & Onello LLP

(57) ABSTRACT

A method of self-aligned shallow trench isolation and a method of manufacturing a non-volatile memory using the same are disclosed. An oxide layer, a first conductive layer and a nitride layer are successively formed on a semiconductor substrate. By using a single mask, the nitride layer, the first conductive layer and the oxide layer are etched to form an oxide layer pattern, a first conductive layer pattern and a nitride layer pattern. Subsequently, the upper portion of the substrate adjacent to the first conductive layer pattern is etched to form a trench. A CVD-oxide layer is deposited on the inner surface of the trench to form a trench inner-wall oxide layer, thereby preventing the formation of a positive profile at the sidewalls of the first conductive layer pattern. The trench inner-wall oxide layer is annealed in an $N_2O$ or NO atmosphere to form an oxynitride layer at the interface between the substrate and trench inner-wall oxide layer. Finally, a field oxide layer that fills up the trench is formed. Because the trench inner-wall oxide layer is formed by a CVD method to prevent the sidewalls of the first conductive layer pattern from having positive slopes, a conductive residue does not remain during a subsequent gate etching process.

17 Claims, 9 Drawing Sheets

METHOD FOR SELF-ALIGNED SHALLOW TRENCH ISOLATION AND METHOD OF MANUFACTURING NON-VOLATILE MEMORY DEVICE COMPRISING THE SAME

BACKGROUND OF THE INVENTION

1. Field of the Invention

The present invention relates to an isolation method and a method of manufacturing a semiconductor device comprising the same. More particularly, the present invention relates to a self-aligned shallow trench isolation (SA-STI) technique that simultaneously forms a gate and an active region, and a method of manufacturing a non-volatile memory device comprising the same.

2. Description of the Related Art

During the manufacture of memory devices, the packing density of cells is primarily determined by the layout of cells within the array and the physical dimensions of the cells themselves. Below the half-micron design rule, scalability of the layout is limited by photolithographic resolution attainable during manufacturing and by alignment tolerances of masks used during production. Alignment tolerances are, in turn, limited by mechanical techniques employed to form masks and the techniques use to register these masks between layers. Because alignment errors accumulate during multi-stage fabrication, it is preferable to use as few masks as possible. Fewer masks minimize the likelihood of misalignment. Accordingly, "self-alignment" processing steps have been developed to produce semiconductor devices.

Isolation structures between individual cells within the memory cell array consume regions of the chip that are otherwise useful for active circuitry. Thus, in order to increase the packing density of memory cell arrays within the substrate, it is desirable to minimize the size of these isolation structures. However, their process of formation and/or the alignment of the structures generally dictate the size of the isolation structure.

Typically, an isolation structure is grown at various regions of the chip by a thermal field oxidation process, such as a LOCal Oxidation of Silicon (hereinafter referred to as "LOCOS"). According to the LOCOS method, after a pad oxide layer and a nitride layer are successively formed, the nitride layer is subjected to patterning. Then, the patterned nitride layer is used as a mask to selectively oxidize the silicon substrate to form field oxide regions. However, in considering the LOCOS isolation, the growth of oxide may encroach upon the side plane of the pad oxide layer under the nitride layer serving as the mask during selective oxidation of the silicon substrate, thereby creating what is called a bird's beak at the end portion of the field oxide layer. Due to the bird's beak, the field oxide layer extends into the active region of the memory cell thereby decreasing the width of the active region. This phenomenon is undesirable because it degrades the electrical characteristics of the memory device.

For this reason, a shallow trench isolation (hereinafter referred to as "STI") structure is used in making ultra-high scale semiconductor devices. In the STI process, a silicon substrate is first etched to form a trench, and then an oxide layer is deposited to fill up the trench. Thereafter, the oxide layer is etched via an etch back or a chemical mechanical polishing (CMP) method so as to form a field oxide layer inside the trench.

The foregoing LOCOS and STI methods commonly include a mask step that defines the regions of the isolation structure on the substrate and a step that forms the field oxide layer within those regions. After forming the isolation structure, steps to form the memory cells are carried out. As such, alignment errors associated with forming the isolation structure and memory cells aggregate to induce misalignment, which may result in failure of the device.

When making a floating gate of a non-volatile memory device, for example, one method of reducing misalignment includes forming STI structure using a self-aligned floating gate, such as by the process disclosed in U.S. Pat. No. 6,013,551 (issued to Jong Chen, et al). According to the method described therein, a floating gate and active region thereof are simultaneously defined and fabricated using a single mask so that alignment errors do not aggregate.

Non-volatile memory devices have long-time storage capacity, e.g., almost indefinitely. In recent years, demand for such electrically erasable programmable read-only memory devices (EEPROMS) or flash EEPROMS has increased. Memory cells of these devices generally have a vertically stacked gate structure comprising a floating gate formed on the silicon substrate with a tunnel oxide layer interposed therebetween, and a control gate formed over and/or around the floating gate with a dielectric (or insulating) interlayer interposed therebetween. In a flash memory cell having this structure, data is stored by transferring electrons to and from the floating gate, which is achieved by applying a controlled voltage to the control gate and substrate. The dielectric interlayer functions to maintain the potential on the floating gate.

FIGS. 1A to 1E are perspective views of a substrate illustrating in succession a method of manufacturing a conventional flash memory device using a self-aligned STI technique. Referring to FIG. 1A, after forming an oxide layer 11 on a silicon substrate 10, a first polysilicon layer 13 and a nitride layer 15 are successively formed on the gate oxide layer 11. The oxide layer 11 serves as a tunnel oxide layer, i.e., a gate oxide layer, of the flash memory cell. The first polysilicon layer 13 serves as a floating gate. The nitride layer 15 serves as a polish-stopping layer during a subsequent chemical mechanical polishing process.

Referring to FIG. 1B, a photolithography process is performed to pattern the nitride layer 15, the first polysilicon layer 13, and the oxide layer 11 to form a nitride layer pattern 16, a first polysilicon layer pattern 14, and an oxide layer pattern 12. Thereafter, exposed portions of the substrate 10 are etched to a predetermined depth to form trenches 18. That is, the active regions and floating gates are simultaneously defined during the trench forming process using a single mask.

Referring to FIG. 1C, exposed portions of trenches 18 are subjected to thermal treatment in an oxygen atmosphere for curing silicon damages caused by high-energy ion bombardment during the trench etching process. By doing so, a trench inner-wall oxide layer 20 is formed along the inner surface including the bottom plane and sidewall of the trenches 18 by the oxidation reaction of the exposed silicon with an oxidant.

As widely known in the art, a reaction for forming an oxide layer is written as below:

As noted from the above reaction, since the diffusion of oxygen into the layer having the silicon (Si) source effects oxidation of silicon, the oxidation reaction occurs at the interface between the first polysilicon layer pattern 14 and the oxide layer pattern 12, and at the interface between the oxide layer pattern 12 and the silicon substrate 10. On the contrary, since the amount of silicon in the edge portions of the first polysilicon layer pattern 14 is smaller than that in the other portions, an oxide layer is less grown on the edge portions than on the plane portions.

Therefore, the volume expansion due to the oxidation is limited on the edges of the interface between the first polysilicon layer pattern 14 and the oxide layer pattern 12 and the interface between the oxide layer pattern 12 and the silicon substrate 10. Since the stress due to the volume expansion is concentrated on these interface edges, the diffusion of oxygen progresses slowly to suppress the oxidation. As a result, because bottom edge portions of the first polysilicon layer pattern 14 are bent outward as shown in FIG. 2, the sidewalls of the first polysilicon layer pattern 14 have positive slope. Here, the positive slope denotes that the slope allows the sidewall erosion with respect to the etchant. In other words, as shown in the drawing, the intrusion of the oxidant into the portion underlying the nitride layer pattern 16 is blocked by the existence of nitride layer pattern 16 to provide the negative slope at the upper portion of the sidewall of the first polysilicon layer pattern 14. Meanwhile, the bottom edge portion of the lower portion of the first polysilicon layer pattern 14 is bent outward to have a positive slope, which is eroded by an etchant introduced from above the substrate in the same manner as in the sidewall of a mesa structure or to act as a stopping layer of the underlying layer when the etchant is applied, which is undesirable.

Referring to FIG. 1D, after forming an oxide layer (not shown) via a chemical vapor deposition (hereinafter referred to as "CVD") method for filling up the trenches 18, the CVD-oxide layer is removed via a CMP process until the upper surface of nitride layer pattern 16 is exposed. As a result, a field oxide layer 22 is formed inside each of the trenches 18. After removing the nitride layer pattern 16 via a phosphoric acid stripping process, a second polysilicon layer 24 for the floating gate is deposited on the first polysilicon layer pattern 14 and the field oxide layer 22. The second polysilicon layer 24 makes contact with the first polysilicon layer pattern 14, and functions to increase the area of the dielectric interlayer that is formed in a subsequent process.

Thereafter, the second polysilicon layer over the field oxide layer 22 is partially etched via a photolithography process to form a second polysilicon layer pattern, and then an ONO dielectric interlayer 26 and a control gate 28 are successively formed on the entire surface of the resultant structure. The control gate 28 is generally formed by a polycide structure obtained by stacking a tungsten silicide layer on a doped polysilicon layer.

Referring to FIG. 1E, the control gate 28 is patterned via a photolithography process. Successively, the exposed dielectric interlayer 26 and the second and first polysilicon layer pattern 24 and 14 are anisotropically etched via a dry etch process. As a result, the stacked gate structure comprising the floating gate 25 consisting of the first and second polysilicon layer patterns 14 and 24 and the control gate 28 is formed on the memory cell region.

At this time, as shown in FIG. 1B, the lower portion of the sidewall of the first polysilicon layer pattern 14 has a positive slope. Therefore, by the characteristic of the anisotropic etching (i.e., where etching is performed only in the vertical direction) of the dry etch process, the bottom edge portion of the first polysilicon layer pattern 14 masked by the field oxide layer 22 is not etched to remain intact. As a result, a line-shaped polysilicon residue 14a is formed along the surface boundary of the active region and the field oxide layer 22. This polysilicon residue 14a forms an electrical bridge between adjacent floating gates, which causes an electrical failure of the device.

SUMMARY OF THE INVENTION

Therefore, it is an object of the present invention to provide a self-aligned shallow trench isolation method for preventing electrical failure of the device.

It is another object of the present invention to provide a method of manufacturing a non-volatile memory device that avoids a positive slope of the sidewalls of the floating gate.

In accordance with the method of the invention, an oxide layer is formed on a semiconductor substrate. A first conductive layer is formed on the oxide layer. A nitride layer is formed on the first conductive layer. The nitride layer, the first conductive layer and the oxide layer are etched by using a single mask to thereby form an oxide layer pattern, a first conductive layer pattern and a nitride layer pattern. By using this mask, the upper portion of the substrate adjacent to the first conductive layer pattern is etched away to form a trench. A CVD-oxide layer is deposited on the inner surface of the trench to form a trench inner-wall oxide layer. The trench inner-wall oxide layer is annealed in an $N_2O$ or NO atmosphere to form an oxynitride layer at the interface between the substrate and the trench inner-wall oxide layer. A field oxide layer is formed for filling up the trench.

In another aspect of the invention, an oxide layer for a gate oxide layer is formed on a semiconductor substrate. A first conductive layer for a floating gate layer is formed on the oxide layer. A nitride layer is formed on the first conductive layer. The nitride layer, the first conductive layer and the oxide layer are etched by using a single mask to thereby form an oxide layer pattern, a first conductive layer pattern and a nitride layer pattern. By using this mask, the upper portion of the substrate adjacent to the first conductive layer pattern is etched away to form a trench aligned to the first conductive layer pattern, thereby defining an active region of the substrate. Thereafter, a trench inner-wall oxide layer is formed by depositing a CVD-oxide layer on the inner surface portion of the trench to prevent the formation of a positive profile at the sidewalls of the first conductive layer pattern. The trench inner-wall oxide layer is annealed in $N_2O$ or NO atmosphere to form an oxynitride layer at the interface between the substrate and the trench inner-wall oxide layer. A field oxide layer is formed for filling up the trench. Finally, a dielectric interlayer and a control gate are formed successively on the first conductive layer pattern.

In one embodiment, the first conductive layer includes either polysilicon or amorphous silicon. The trench inner-wall oxide layer can be formed at a temperature of about 700 to 850° C. the annealing in the $N_2O$ or NO atmosphere can be performed at a temperature of about 700 to 850° C. The trench inner-wall oxide layer can be formed to a thickness of about 20 to 300 Å.

In one embodiment formation of the trench inner-wall oxide layer and the annealing are performed in situ in a single reaction chamber. In an alternative embodiment, they are performed in separate chambers. In one embodiment, the field oxide layer is formed by forming a gap-fill oxide layer covering the nitride layer pattern while filling the trench and etching the gap-fill oxide layer to have a smooth surface by either chemical mechanical polishing or an etchback until the surface of the nitride layer pattern is exposed.

According to the present invention, the trench inner-wall oxide layer is formed by a chemical vapor deposition (CVD)

to prevent the sidewalls of the first conductive layer pattern from having the positive slope. By doing so, conductive residue does not remain during a subsequent gate etching process, which prevents the failure of the device.

Further, after the above CVD process, the annealing for the densification of the CVD oxide is performed in an $N_2O$ or NO atmosphere to decrease the leakage current. In addition, the oxynitride layer is formed at the interface between the silicon substrate and the trench inner-wall oxide layer, to thereby enhance the interface charge characteristics and to prevent the out-diffusion of dopants from the active region adjacent to the trench.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Hereinafter, preferred embodiments of the present invention are described with reference to the accompanying drawings. Whenever a layer, structure, or pattern is described herein as being on, lying over, or covering another layer, pattern, or structure, it is meant that an interceding layer, pattern, or structure may or may not be included.

Figure 3A:
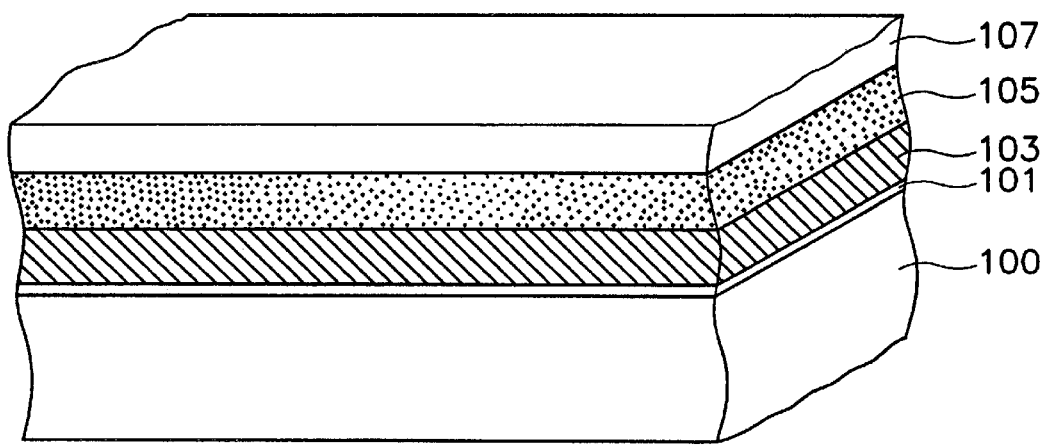
FIGS. 3A to 3H illustrate a method of manufacturing a non-volatile memory device using a self-aligned shallow trench isolation process according to the present invention.

FIGS. 3A to 3H are perspective views illustrating a method of manufacturing a non-volatile memory device using a self-aligned shallow trench isolation process according to the present invention. Referring to FIG. 3A, a silicon oxide layer or silicon oxynitride layer is grown on a semiconductor substrate 100 comprising a material such as silicon, to form an oxide layer 101 which is to be used as a gate oxide layer (e.g., tunnel oxide layer) of a cell transistor. A polysilicon layer or an amorphous silicon layer is deposited on the oxide layer 101 to a thickness of about 300 to 1000 Å via the LPCVD method. Then, the layer is doped with a high-concentration of N-type impurity via a typical doping method, e.g., $POCl_3$ diffusion, ion implantation or in-situ doping, etc, to thereby form a first conductive layer 103.

Here, in case that the first conductive layer 103 is deposited as the amorphous phase and doped via in-situ doping, the grain size changes from the amorphous phase to the crystalline phase due to the thermal budget in subsequent processes, thereby deteriorating the underlying gate oxide layer. On the contrary, in case that the first conductive layer 103 deposits as the crystalline phase at the temperature of 600° C. or more, the phase transformation is limited, so that the deposited layer exhibits low stress.

Then, a nitride layer 105 is deposited on the first conductive layer 103 to a thickness of about 1000 to 2000 Å via a LPCVD method. The nitride layer 105 serves as a polish-stopping layer during a subsequent CMP process. Thereafter, a high temperature oxide (HTO) layer 107 is deposited on the nitride layer 105 to a thickness of about 500 to 1000 Å via the LPCVD method. Silicon oxynitride (SiON) is deposited on the HTO layer 107 to a thickness of about 200 to 800 Å via the LPCVD method, thereby forming an anti-reflective layer (not shown). The anti-reflective layer plays a role of preventing the reflection of light from the underlying substrate during a subsequent photolithography process. The anti-reflective layer will be removed during a subsequent process of forming a trench.

Figure 3B:
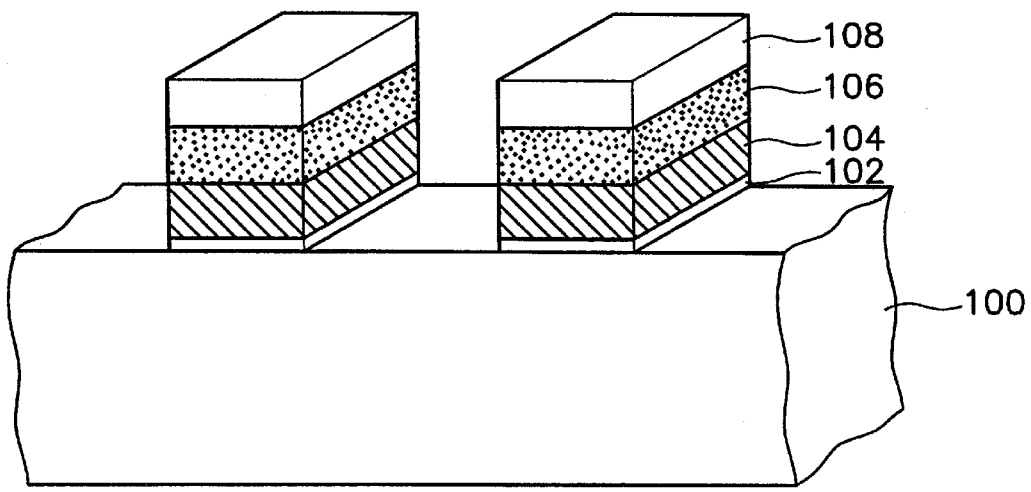

Referring to FIG. 3B, via a photolithography process for defining a floating gate, the anti-reflective layer and the HTO layer 107 are dry etched to form a mask pattern 108. Then, using the mask pattern 108 as an etch mask, the nitride layer 105, the first conductive layer 103 and the oxide layer 101 are dry etched to form an oxide layer pattern 102, a first conductive layer pattern 104 and a nitride layer pattern 106.

Figure 3C:
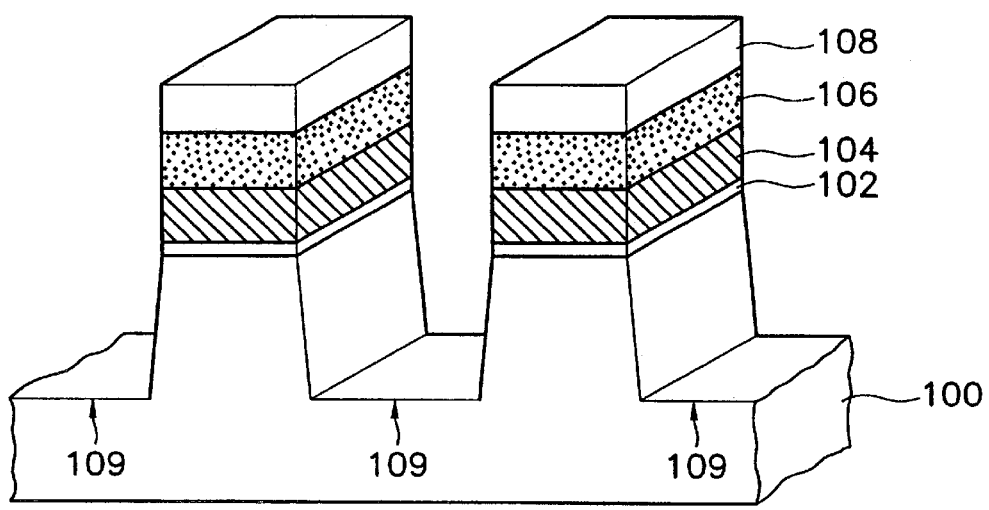

Referring to FIG. 3C, using the mask pattern 108 as an etch mask, the upper portion of the substrate 100 adjacent to the first conductive layer pattern 104 is etched away to a depth of about 2000 to 5000 Å thereby forming trenches 109. At this time, the anti-reflective layer that was formed optionally in the above step is removed, and simultaneously, the mask pattern 108 is etched to a predetermined thickness.

As a result, the first conductive layer patterns 104 are separated from one another by the trenches 109. By forming the trenches 109, the active region and floating gate are simultaneously defined using a single mask. Accordingly, the floating gate is self-aligned with the active region.

Figure 3D:
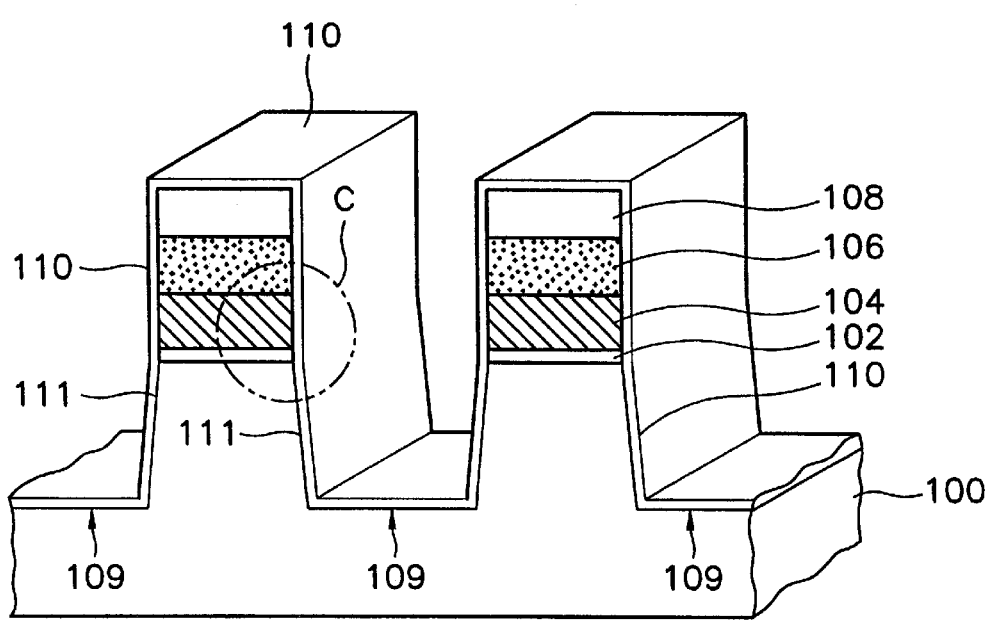

Referring to FIG. 3D, in order to eliminate silicon damage caused by high energy ion impact during the trench etching and to prevent the leakage current caused due to the movement of dopants from a gap-fill oxide layer that will be formed during a subsequent process to the silicon substrate 100, an oxide layer is deposited on the inner surfaces of the trenches 109 to a thickness of about 20 to 300 via the CVD method, to thereby form a trench inner-wall oxide layer 110 on the bottom plane and sidewalls of the trenches 109. Specifically, after loading substrate 100 into the CVD chamber maintained at a temperature of about 400 to 650° C. the temperature is increased over the range of about 700 to 850° C., preferably 750° C. Then, a silane ($SiH_4$) gas and an $N_2O$ gas are introduced into the chamber at a pressure of about 10 to 100 Pa to deposit a $SiO_2$ film for trench inner-wall oxide layer 110 to a thickness of about 20 to 300 Å. At this time, a dichlorosilane (DCS) may be used instead of the silane gas. Successively, after increasing the temperature over the range of about 750 to 1000° C., preferably 850° C., in the same chamber, an annealing is performed in $N_2O$ or NO atmosphere to grow a $SiO_2$ film to a thickness of about 5 to 50 Å.

Figure 1A:
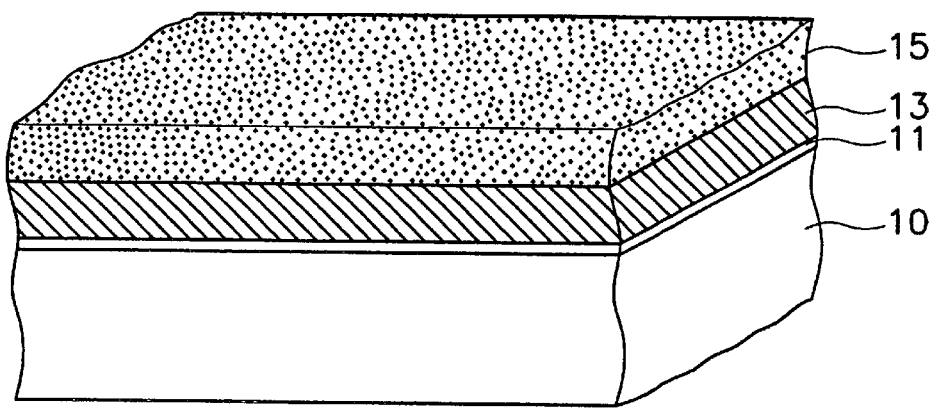
FIGS. 1A to 1E illustrate a method of manufacturing a flash memory device using the self-aligned shallow trench isolation process according to the prior art.
Figure 1B:
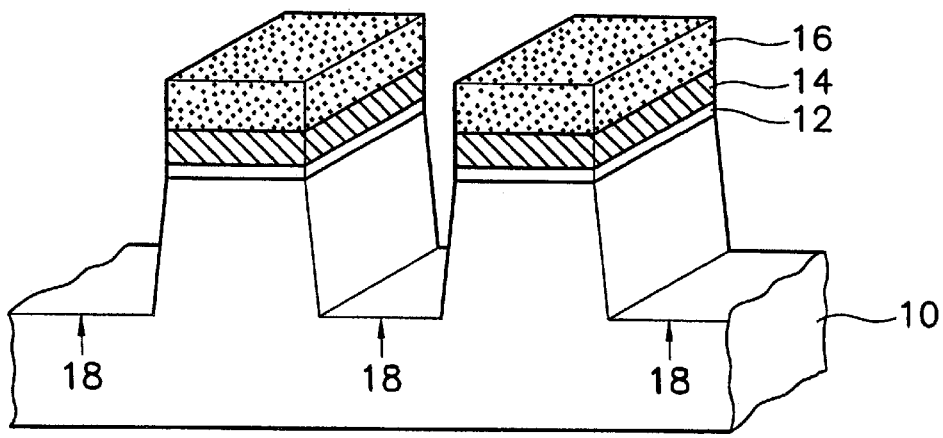
Figure 1C:
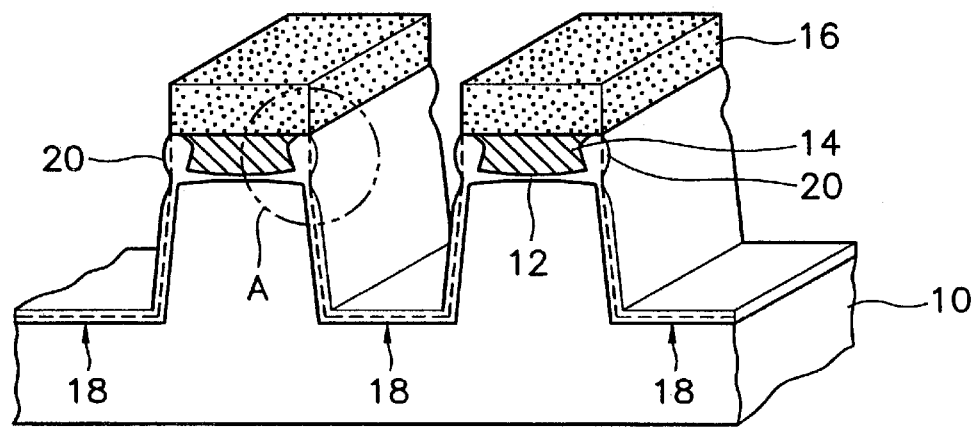
Figure 1D:
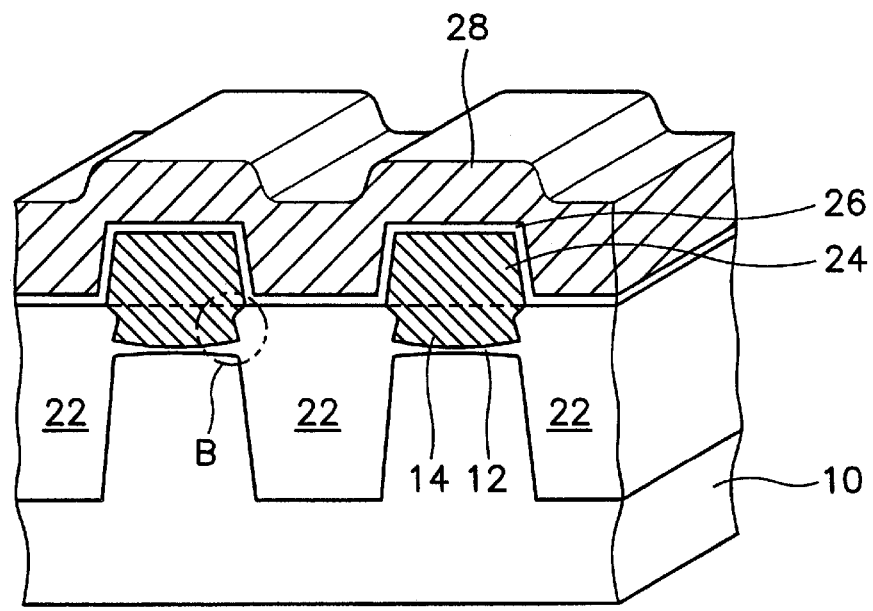
Figure 1E:
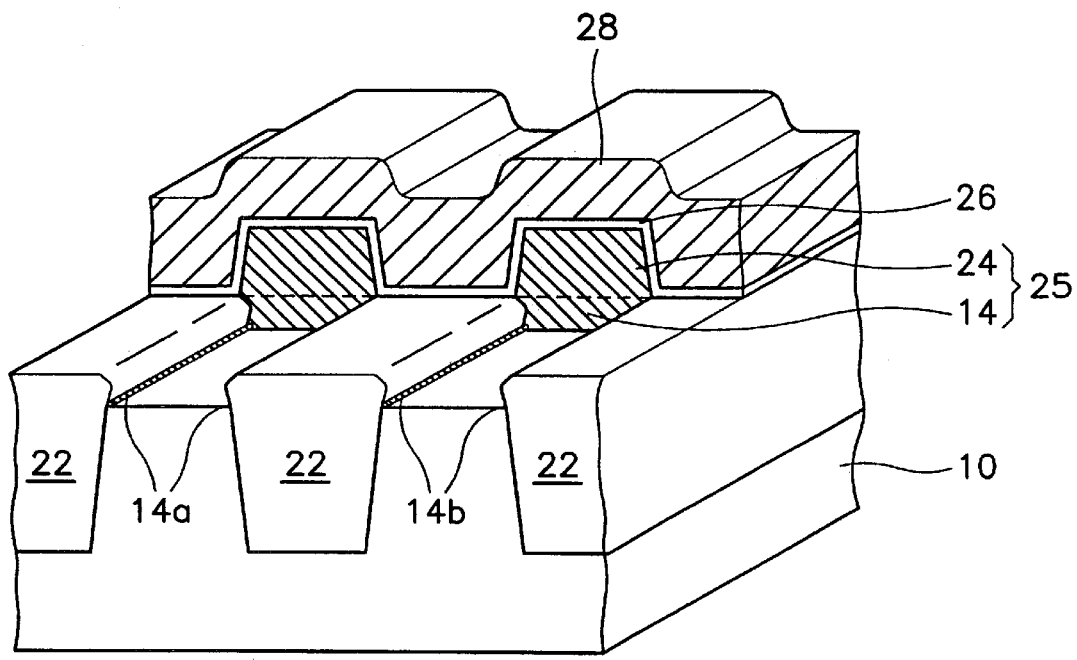
Figure 2:
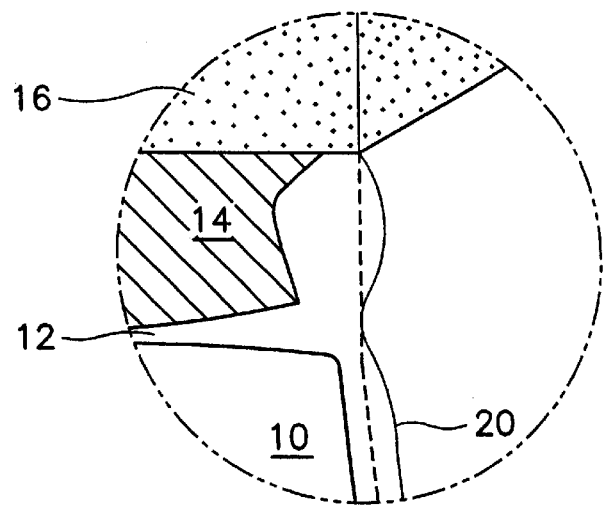
FIG. 2 is an enlarged sectional view showing portion A of FIG. 1C.

According to the prior art in which the trench inner-wall oxide layer is formed via a thermal oxidation, the oxidation is limited on the edges of the interface between the first conductive layer pattern and the oxide layer pattern. As a result, the bottom edge portions of the first conductive layer pattern are bent outward as shown in FIG. 2, so that the sidewalls thereof have positive slopes.

Figure 4:
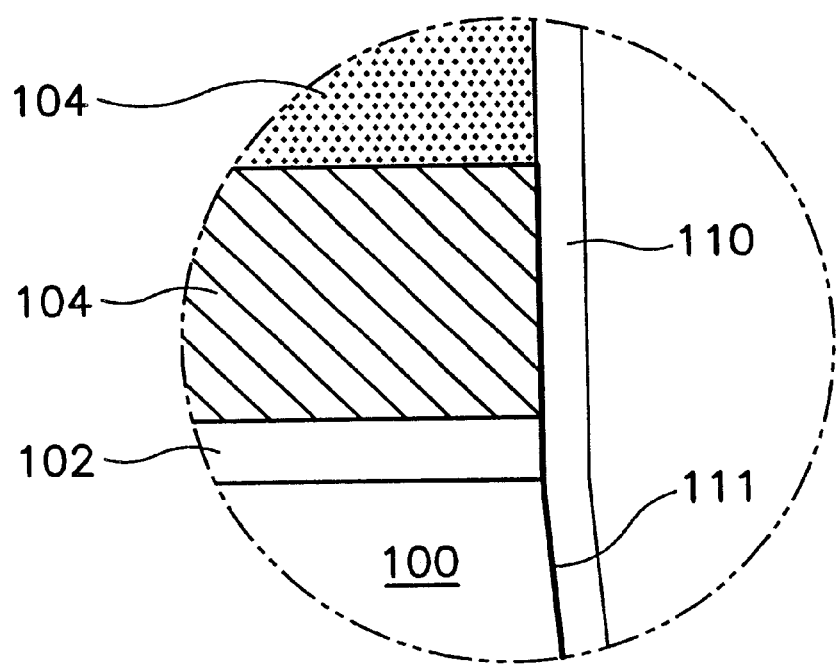
FIG. 4 is an enlarged sectional view showing portion C of FIG. 3D.

On the contrary, since the trench inner-wall oxide layer 110 is formed via a CVD method in the present invention, the trench inner-wall oxide layer 110 is deposited uniformly to a constant thickness regardless of the underlying layer, as shown in FIG. 4. As a result, the sidewall portion of the first silicon layer pattern 104 is not deformed, thereby preventing the sidewalls thereof from having positive slopes. Further, after forming the trench inner-wall oxide layer 110, the annealing of $N_2O$ or NO atmosphere is performed to obtain the densification of the trench inner-wall oxide layer 110, which makes the properties of the CVD-oxide film approach those of thermal oxide film.

According to the present invention, due to the annealing trench inner-wall oxide layer 110 in the $N_2O$ or NO atmosphere, an oxynitride (SiOxNy) layer 111 is formed at the interface between the substrate 100 and the trench inner-wall oxide layer 110. That is, due to the annealing of $N_2O$ or NO atmosphere, nitrogen is piled up at the interface between the substrate 100 and the trench inner-wall oxide layer 110, thereby forming the oxynitride layer 111. Since the oxynitride layer 111 enhances the interface charge characteristics to the substrate 100, the CVD-oxide film having the properties similar to those of the thermal oxide film can be obtained. Further, the oxynitride layer 111 serves as a barrier layer for physically blocking the out-diffusion of dopants from the active region adjacent to the trenches 109 by a subsequent heat budget.

Here, as described above, the deposition process of the trench inner-wall oxide layer 110 and the annealing process of $N_2O$ or NO atmosphere can be performed in-situ, i.e., in the same chamber without repositioning the structure. Alternatively, these two processes may be performed in a separate reaction chamber. In case that the deposition and annealing processes are performed in a separate reaction chamber, the film can be more densified by increasing the annealing temperature. On the contrary, since NO gas is a toxic gas, it is preferred to use $N_2O$ gas by considering the environmental contamination.

Figure 3E:
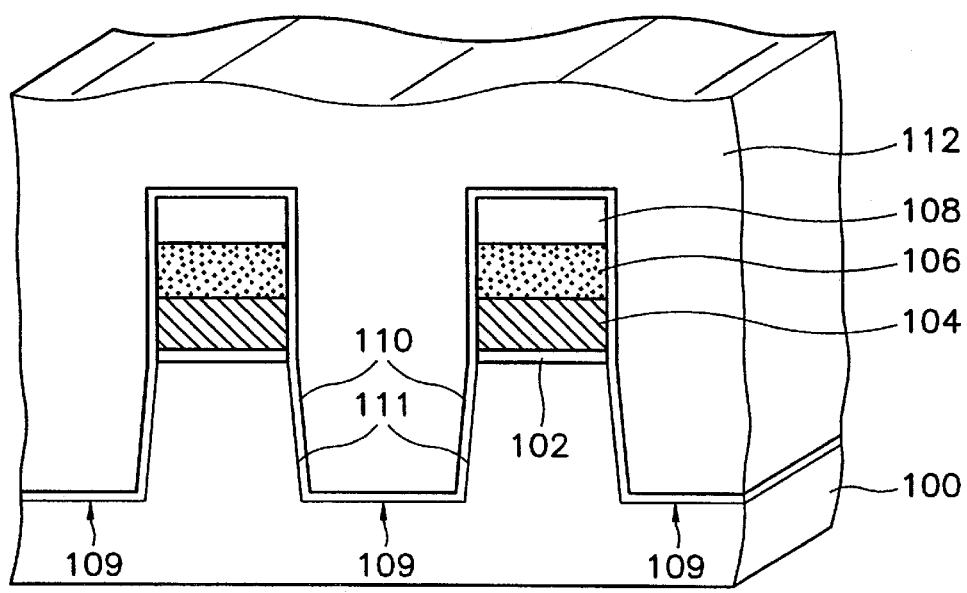

Referring to FIG. 3E, a gap-fill oxide layer 112 with good gap-filling characteristics, e.g., USG (undoped silicate glass), $O_3$-TEOS (tetra-ethyl ortho-silicate) USG or HDP oxide layer, is deposited via a CVD method to a thickness of about 5000 Å in order to fill the trenches 109. Preferably, high-density plasma (HDP) oxide layer is formed using $SiH_4$, $O_2$ and Ar gases as a plasma source. At this time, the trenches 109 are filled by enhancing the gap-filling capability of the HDP oxide layer so as not to cause leaks or voids inside the trenches 109.

Successively, a capping oxide layer (not shown) formed of PE-TEOS (plasma-enhanced TEOS) may be deposited on the gap-fill oxide layer 112 via a plasma method, which uses $Si(OC_2H_5)_4$ as a source. Optionally, the gap-fill oxide layer 112 is densified by annealing at a high temperature of about 800 to 1050° C. in an inert gas atmosphere to lower the wet etch rate with respect to a subsequent cleaning process.

Figure 3F:
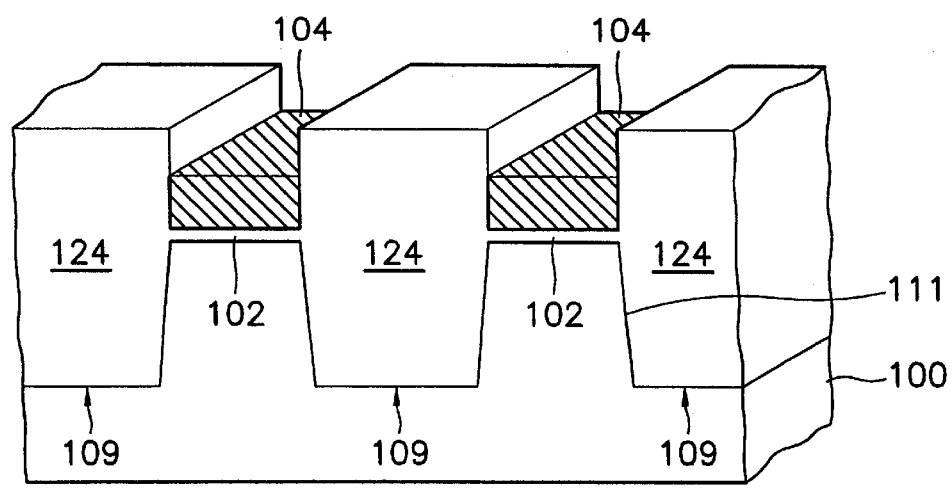

Referring to FIG. 3F, the gap-fill oxide layer 112 is planarized. Planarization is performed via an etchback or CMP process until the upper surface of the nitride layer pattern 106 is exposed. Thus, the gap-fill oxide layer 112 on the nitride layer pattern 106 is removed to thereby create the field oxide layer 124 inside the trenches 109. Then, the nitride layer pattern 106 is removed via a stripping process using phosphoric acid to expose the first conductive layer pattern 104.

Figure 3G:
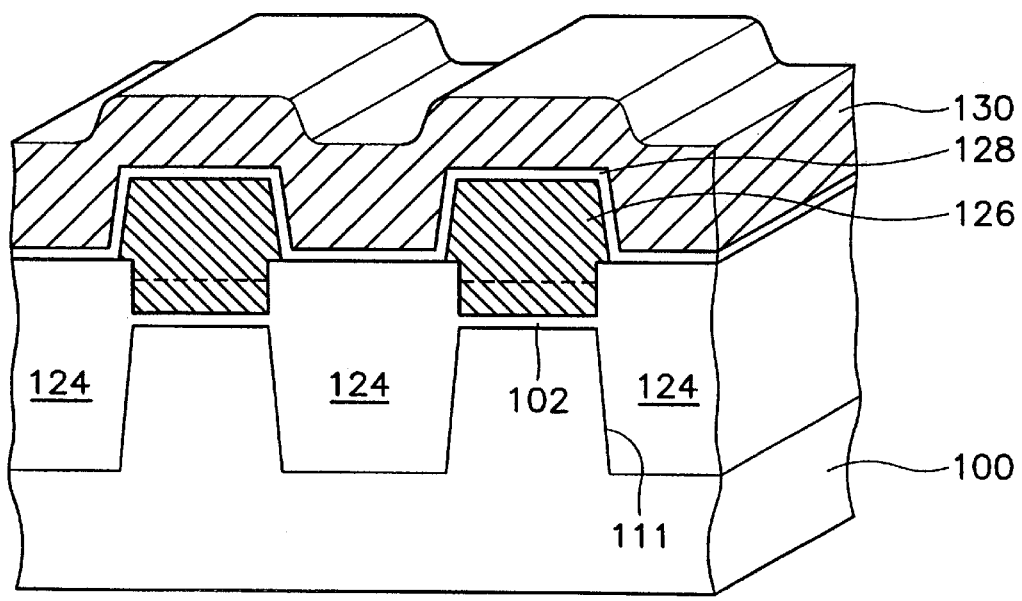

Referring to FIG. 3G, a pre-cleaning step is performed to clean the substrate for about 30 seconds using an etchant including fluoride acid. The field oxide layer 124 is partially removed by stripping the nitride layer pattern 106 and by the pre-cleaning process. At this time, the thickness of approximately over 250 Å of the field oxide layer 124 is reduced.

Then, a polysilicon layer or an amorphous silicon layer is deposited on the first conductive layer pattern 104 and the field oxide layer 124 via a LPCVD method to a thickness of about 1000 to 3000 Å. Subsequently, the layer is doped with a high concentration of N-type impurity via a typical doping method, e.g., $POCl_3$ diffusion, ion implantation or in-situ doping, thereby forming a second conductive layer. The second conductive layer thus deposited lies in electrical contact with the first conductive layer pattern 104. The second conductive layer is formed in order to increase the area of a dielectric interlayer formed in a subsequent process, which is preferably formed as thick as possible. In the flash memory cell having SA-STI structure, the area of the first conductive layer pattern 104 which is self-aligned with the active region is smaller than that of the conventional floating gate. Therefore, it is preferable the second conductive layer be deposited additionally to increase the sidewall height of the floating gate, thereby enlarging the area of the dielectric interlayer.

Then, the second conductive layer on the field oxide layer 124 is partially removed via a photolithography process to form a second conductive layer pattern 126. As a result, the floating gates are separated from those of the neighboring cells.

An ONO dielectric interlayer 128 for maintaining the charges accumulated in the floating gate and transferring the control gate voltage to the floating gate is formed on the second conductive layer pattern 126. For example, after the second conductive layer pattern 126 is oxidized to grow a first oxide layer to a thickness of about 100 Å, a nitride layer is deposited thereon to a thickness of about 130 Å and a second oxide layer to a thickness of about 40 Å is deposited on the nitride layer, thereby forming the dielectric interlayer 128 having a thickness of about 100 to 200 Å in total.

Then, a control gate 130 which is obtained by stacking an $N^+$ type-doped polysilicon layer and a metal silicide layer such as tungsten silicide WSix, titanium silicide TiSix, cobalt silicide CoSix, and tantalum silicide TaSix is formed on the dielectric interlayer 128. Preferably, the polysilicon layer of the control gate 130 is formed to a thickness of about 1000 Å, and the metal silicide layer thereof is formed to a thickness of about 1000 to 1500 Å.

Figure 3H:
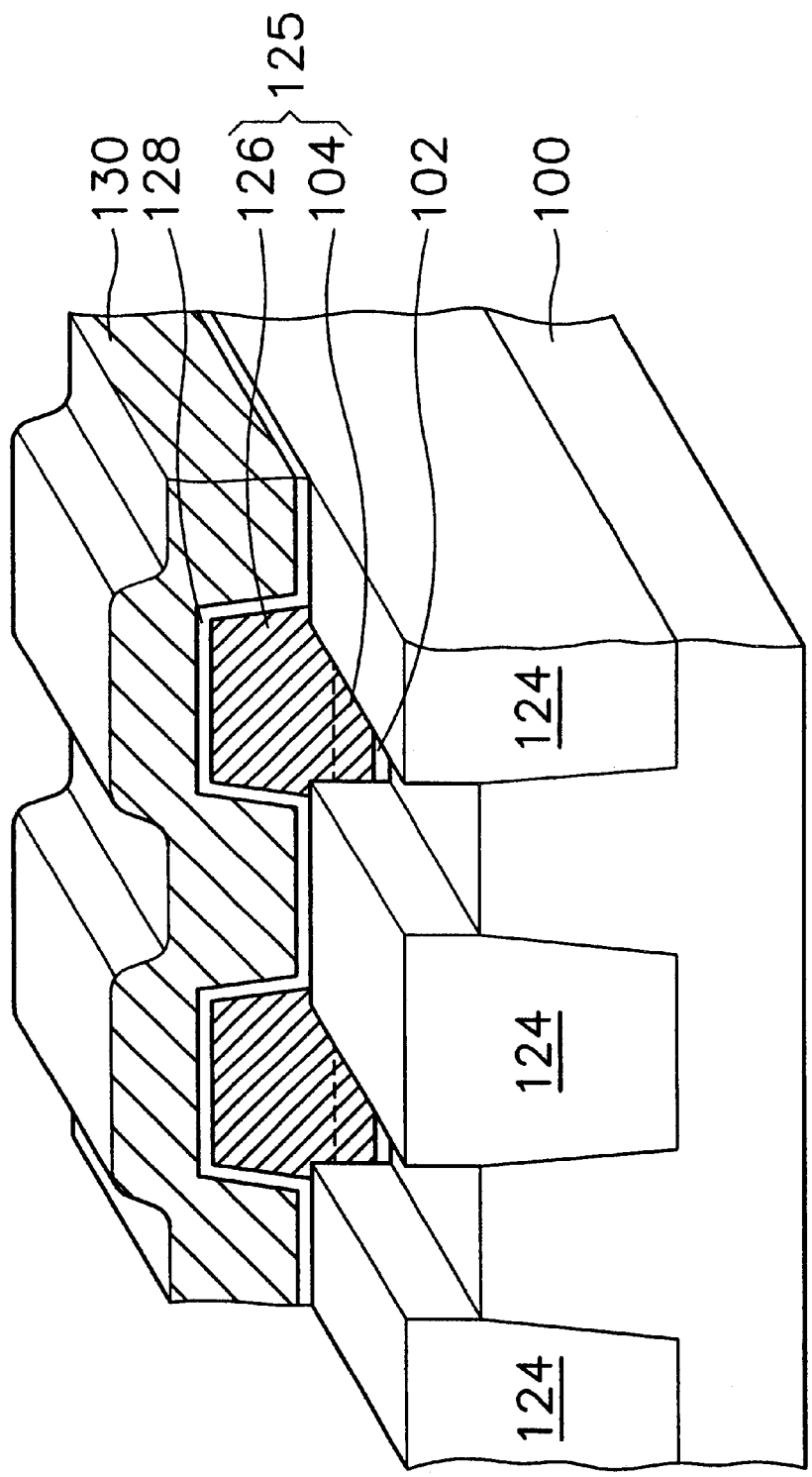

Referring to FIG. 3H, after patterning the control gate 130 via the photolithography process, the exposed dielectric interlayer 128, the second conductive layer pattern 126 and the first conductive layer pattern 104 are successively patterned in each cell unit via a dry etch method, thereby forming the stacked gate comprising the floating gate 125 consisting of the first and second conductive layer patterns 104 and 126 and the control gate 130 on the memory cell region.

Because the sidewall of the first conductive layer pattern 104 has no positive slope, the exposed portions of the first conductive layer 104 are completely removed during the above-described dry etch process. Therefore, silicon residue does not remain at the surface boundary between the field oxide layer 124 and the active region.

Thereafter, though not shown in the drawing, the source/drain regions of the memory cell are formed by ion implantation, and the dielectric interlayer (ILD) is then coated on the resultant structure. After forming a contact hole for exposing the source/drain regions by etching the ILD, a contact plug filling up the contact hole is formed. Then, a metallization layer electrically in contact with the contact plug is deposited, and a back-end process is performed by using an intermetal dielectric layer (IMD), a via hole and a metal mask.

According to the invention described above, the trench inner-wall oxide layer is formed by a CVD method to prevent the sidewalls of the first conductive layer pattern from having positive slope. By doing so, the exposed portions of the first conductive layer pattern are completely removed by a subsequent gate etching process, so that a conductive residue does not remain at the surface boundary between the field oxide layer and the active region. The absence of this residue helps avoid electrical failures of the device caused by electrical shorting of the neighboring gates.

Further, after the above CVD process, the annealing for the densification of the CVD oxide is performed in an $N_2O$ or NO atmosphere to decrease the leakage current. In addition, the oxynitride layer is formed at the interface between the silicon substrate and the trench inner-wall oxide layer, which enhances the interface charge characteristics and prevents the out-diffusion of dopants from the active region adjacent to the trench.

In addition to the uniform formation of a floating gate layer, the invention has application in the formation of other conductive layers within a semiconductor device where uniformity is desired. In other words, the invention has application wherever there is a need to avoid the bird's beak phenomenon described herein.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method for self-aligned shallow trench isolation comprising:
   forming a first oxide layer on a semiconductor substrate;
   forming a first conductive layer on said first oxide layer;
   forming a nitride layer on said first conductive layer;
   forming a second oxide layer on said nitride layer;
   forming an anti-reflective layer on said second oxide layer;
   etching said anti-reflective layer, said second oxide layer, said nitride layer, said first conductive layer and said first oxide layer using a single mask, to thereby form a first oxide layer pattern, a first conductive layer pattern, a nitride layer pattern, a second oxide layer pattern and an anti-reflective layer pattern;
   etching the upper portion of said substrate adjacent to said first conductive layer pattern by using said mask, to thereby form a trench and to simultaneously remove said anti-reflective layer pattern;
   forming a trench inner-wall oxide layer on the inner surface of said trench by chemical vapor deposition (CVD) to prevent the formation of a positive profile at sidewalls of said first conductive layer pattern;
   annealing said trench inner-wall oxide layer in one of an $N_2O$ and NO atmosphere to form an oxynitride layer at the interface between said substrate and said trench inner-wall oxide layer; and
   forming a field oxide layer for filling up the trench.

2. The method as claimed in claim 1, wherein said first conductive layer comprises at least one of polysilicon and amorphous silicon.

3. The method as claimed in claim 1, wherein said trench inner-wall oxide layer is formed at a temperature of about 700 to 850° C.

4. The method as claimed in claim 1, wherein said annealing of $N_2O$ or NO atmosphere is performed at a temperature of about 700 to 850° C.

5. The method as claimed in claim 1, wherein said trench inner-wall oxide layer is formed to a thickness of about 20 to 300 Å.

6. The method as claimed in claim 1, wherein the step of forming said trench inner-wall oxide layer and the step of annealing in one of an $N_2O$ and NO atmosphere are performed in-situ in the same reaction chamber.

7. The method as claimed in claim 1, wherein the step of forming said trench inner-wall oxide layer and the step of annealing in one of an $N_2O$ and NO atmosphere are performed in a separate reaction chamber.

8. The method as claimed in claim 1, wherein said field oxide layer is formed by forming a gap-fill oxide layer covering said nitride layer pattern while filling up said trench, and etching said gap-fill oxide layer to have a smooth surface via one of a chemical mechanical polishing method and an etchback method until the surface of said nitride layer pattern is exposed.

9. A method of manufacturing a non-volatile memory device comprising:
   forming a first_oxide layer for a gate oxide layer on a semiconductor substrate;
   forming a first conductive layer on said oxide layer;
   forming a nitride layer on said first conductive layer;
   forming a second oxide layer on said nitride layer;
   forming an anti-reflective layer on said second oxide layer;
   etching said anti-reflective layer, said second oxide layer, said nitride layer, said first conductive layer and said first oxide layer using a single mask, to thereby form a first oxide layer pattern, a first conductive layer pattern, a nitride pattern, a second oxide layer pattern and an anti-reflective layer pattern;
   etching the upper portion of said substrate adjacent to said first conductive layer by using said mask, to thereby form a trench aligned with said first conductive layer pattern for defining an active region of said substrate and to simultaneously remove said anti-reflective layer pattern;
   forming a trench inner-wall oxide layer on the inner surface of said trench by chemical vapor deposition (CVD), to prevent the formation of a positive profile at sidewalls of said first conductive layer pattern;
   annealing said trench inner-wall oxide layer in one of an $N_2O$ and NO atmosphere to form an oxynitride layer at the interface between said substrate and said trench inner-wall oxide layer;
   forming a field oxide layer for filling up the trench; and
   successively forming a dielectric interlayer and a control gate on said first conductive layer pattern.

10. The method as claimed in claim 9, wherein said first conductive layer comprises at least one of polysilicon and amorphous silicon.

11. The method as claimed in claim 9, wherein said trench inner-wall oxide layer is formed at a temperature of about 700 to 850° C.

12. The method as claimed in claim 9, wherein said annealing in one of the $N_2O$ and NO atmosphere is performed at a temperature of about 700 to 850° C.

13. The method as claimed in claim 9, wherein said trench inner-wall oxide layer is formed to a thickness of about 20 to 300 Å.

14. The method as claimed in claim 9, wherein the step of forming said trench inner-wall oxide layer and the step of annealing in one of an $N_2O$ and NO atmosphere are performed in-situ in the same reaction chamber.

15. The method as claimed in claim 9, wherein the step of forming said trench inner-wall oxide layer and the step of annealing in one of an $N_2O$ and NO atmosphere are performed in a separate reaction chamber.

16. The method as claimed in claim 9, wherein said field oxide layer is formed by forming a gap-fill oxide layer covering said nitride layer pattern while filling up said trench, and etching said gap-fill oxide layer to have a smooth surface via at least one of a chemical mechanical polishing method and an etch back method until the surface of said nitride layer pattern is exposed.

17. The method as claimed in claim 9, further comprising forming a second conductive layer for the floating gate on said first conductive layer pattern and said field oxide layer; and removing said second conductive layer on said field oxide layer to form a second conductive layer pattern, before forming said dielectric interlayer.

* * * * *